United States Patent [19]
Reid

[11] 4,295,123
[45] Oct. 13, 1981

[54] ANALOG-TO-DIGITAL CONVERTER

[76] Inventor: Samuel C. M. Reid, R.F.D. 2, Peppers Ferry Rd., Radford, Va. 24141

[21] Appl. No.: 61,509

[22] Filed: Jul. 27, 1979

[51] Int. Cl.³ .......................................... H03K 13/02
[52] U.S. Cl. ........................ 340/347 AD; 235/201 R
[58] Field of Search ......... 340/347 AD; 235/201 HL, 235/201 PF, 201 R; 137/487.5; 73/861

[56] References Cited
U.S. PATENT DOCUMENTS

| | | | |
|---|---|---|---|
| 3,021,517 | 2/1962 | Kaenel | 340/347 AD |
| 3,100,298 | 8/1963 | Fluhr | 340/347 AD |
| 3,576,291 | 4/1971 | Taplin | 235/201 PF |
| 4,005,410 | 1/1977 | Michael | 340/347 AD |

Primary Examiner—Charles D. Miller
Attorney, Agent, or Firm—Henderson & Sturm

[57] ABSTRACT

An analog to digital converter device is disclosed. The device includes a plurality of serially connected stages representing bits, each stage including generally a source of current or fluid and a second current or fluid source of opposite polarity, a current or flow direction controlled voltage or pressure drop unit, a comparator unit and a current or flow switch or valve responsive thereto for controlling the source of current or fluid flow.

16 Claims, 7 Drawing Figures

ANALOG-TO-DIGITAL CONVERTER

BACKGROUND OF THE INVENTION

This invention relates generally to the art of electronic or fluid flow signal apparatus, and more particularly to the art of analog-to-digital converters.

An analog signal may be described as one that varies as a continuous function of time and is capable of assuming an infinite number of values, usually between an upper and lower limit. A digital signal, on the other hand, must conform to more rigid standards. A digital signal must assume the guise of either a "high" or a "low" signal, often referred to as a "1" or a "0", respectively. These "highs" and "lows" may be used to perform a variety of mathematical functions within the binary number system; such capability forming the backbone of the modern digital computer.

Unfortunately, while digital signals are uniquely suited for use with such computers, most signals as they are found in actual operating systems are of the analog variety. Since such analog systems are inherently unsuitable for use with digital systems, a need arose to make the two compatible. The answer was to convert the analog signal into a digital counterpart. That is, a given analog signal would be subdivided into a number of smaller parts, and each part would be ascribed a binary number assignment. In this way any analog signal could be approximated as a binary number, the number being represented by a digital signal suitable for digital arithmetic calculations. Needless to say, the larger the number of subdivisions and the smaller the part was with respect to the largest possible analog signal, the greater the accuracy of the digital approximations as represented by a concurrently larger number of bits, or parts, as described above.

A number of analog-to-digital converters are well known in the prior art. One in particular utilizes a string of comparator units, each having a successively smaller reference signal, such that the input analog signal may be particularized by the various selected thresholds. One great advantage of this system is its relatively high operating speed. Unfortunately, this technique must usually be limited to only a small number of digital bits due to the many comparators required. This problem has been specifically defined in a handbook entitled *Data Conversion Handbook*, copyright 1974, by Donald B. Buck of Hybrid Systems Corporation. In particular, at page 3-3 of the above identified handbook, the author notes, "because this technique requires a comparator for each state or level, $2^n-1$ comparators are needed to digitize to n-bit resolution and, hence, the number of comparators quickly becomes prohibitive from a cost and size point of view. An 8-bit encoding, for example, would necessitate ($2^8=256$) 255 comparators. Further, due to realities such as ground loops, input loading, etc., the tendency to oscillate also restricts the maximum number of comparators, hence bits of resolution, which are feasible to use. While 4 bits (15 comparators) in 20–50 nano seconds is fairly easily achieved, 7 bits (127 comparators) would be an ambitious, and perhaps suicidal task."

Other lower speed ways of performing an analog-to-digital conversion include the ramp staircase method, the successive approximation method, the single-slope integrating method, the dual-slope integrating method and the voltage-to-pulse rate method. Other methods and apparatus may be found at U.S. Pat. No. 3,638,218 to Kaneko et al and U.S. Pat. No. 3,641,562 to Hlotorda.

The competing interests are easily discernible from the above. On the other hand, accuracy and speed are coveted, for these are parameters and capabilities a digital computer is inherently well qualified to exploit. On the other hand, physical reduction to practice must include some finite number of elements, which may not be compatible with the desired accuracy. What is more, under the prior art systems, accuracy of even a moderate degree is obtained at the great sacrifice of speed.

SUMMARY OF THE INVENTION

It is therefore a primary object of this invention to provide a high speed analog-to-digital converter.

It is another object of this invention to provide a high speed analog-to-digital converter that will utilize the same number of comparator units as there are digital bits required.

It is another object of this invention to provide an analog-to-digital converter that will operate at high speeds.

It is another object of this invention to provide a high speed analog-to-digital converter wherein an analog input signal is converted or modified to produce a unique but consistent relationship between an analog type signal input and a digital code made up of logical "ones" and "zeros".

it is another object of this invention to provide a high speed analog-to-digital converter that necessitates the use of only a relatively few number of components.

Still another object of this invention is to provide a high speed analog-to-digital converter that retains the high speed characteristic of that type of analog-to-digital converter characterized by $2^n-1$ comparators for an n-bit resolution while requiring only n comparators.

Yet still another object of this invention is to provide a high speed analog-to-digital converter that is economical of manufacture, durable of construction and efficient in use.

These objects and others are realized by the provision of a high speed analog-to-digital converter. The converter includes a plurality of serially connected stages representing bits, each stage including generally a source of current or fluid and a second current or fluid source of opposite polarity, a current or flow direction controlled voltage or pressure drop unit, a comparator unit and a current or flow switch or valve responsive thereto for controlling the source of current or fluid flow.

BRIEF DESCRIPTION OF THE DRAWINGS

These objects will become more readily apparent upon reference to the following detailed description, and especially when studied in conjunction with the appended drawings, wherein.

DESCRIPTION OF THE PREFERRED EMBODIMENTS

Figure 1:
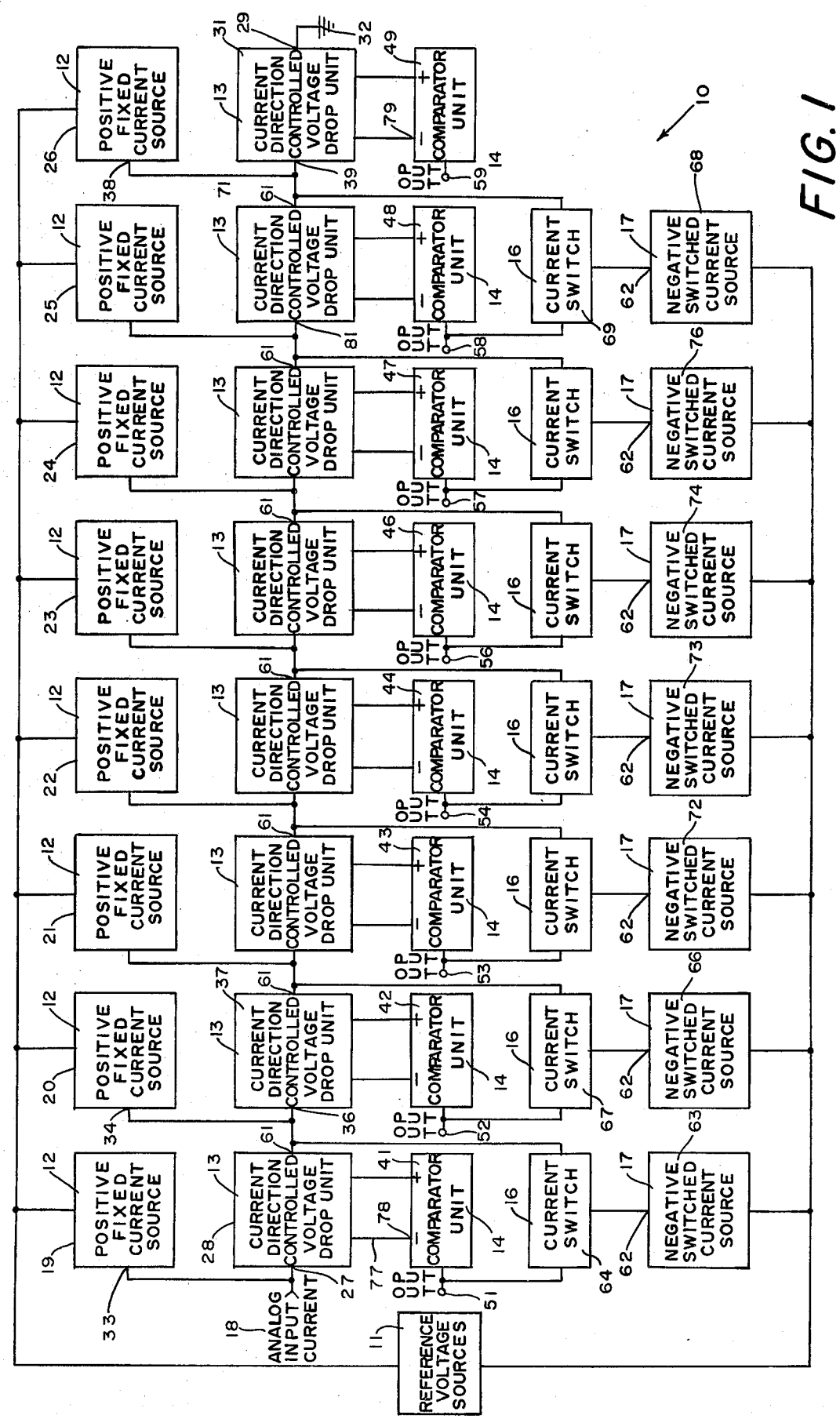
FIG. 1 is a block diagram of a figurative embodiment of the invention.
Figure 2:
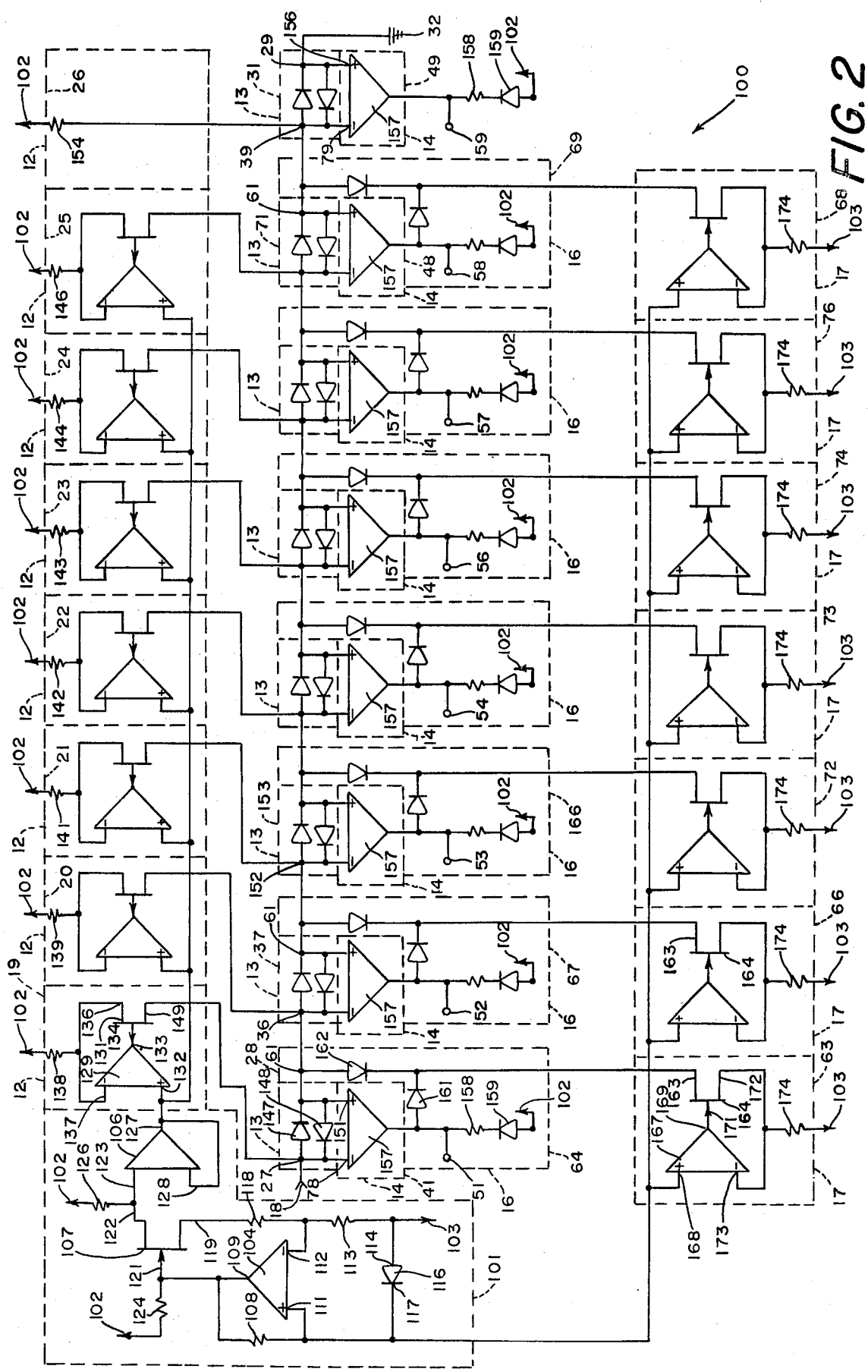
FIG. 2 is a schematic view of a preferred embodiment of the invention.

With reference to FIG. 1, a figurative embodiment of the apparatus of the instant invention may be seen as denoted generally by the numeral 10. More specifically, the figurative embodiment 10 includes a reference voltage sources 11, a plurality of positive fixed current sources 12, a plurality of current direction controlled voltage drop units 13, a plurality of comparator units 14, a plurality of current switches 16 and a plurality of negative switched current sources 17. For the purposes of this disclosure, the figurative embodiment 10 of the apparatus and the operation thereof will be disclosed first, followed by the description of a preferred embodiment composed of distinct elements as schematically represented in FIG. 2 for accomplishing the teachings of the figurative embodiment 10.

The embodiment 10 as represented herein is for the realization of an 8 bit digital rendering of an analog input signal 18. It will be well understood by those skilled in the art that the principles taught herein may easily be expanded or contracted to produce a digital output of more or fewer bits. For the purposes of illustration only, it will be assumed that the incoming analog signal 18 is one that varies between 0 and −16 milliamps. In order to convert a continuously varying analog input current 18 having a range of 0 to −16 ma to an eight bit digital equivalent, the current range is divided into $2^8$ or 256 equal parts (0 to 255). Therefore, in this disclosure, each of the 256 output states will represent 1/16 ma. It should be understood that the parameters and values described further herein are disclosed only for the purposes of illustrating compatability with such an analog input 18, and that other parameters and values could be determined by means well known in the prior art to accomodate other ranges of input.

The reference voltage sources 11 provides a positive 8.2 volts for biasing the positive fixed current sources 12 and a negative 8.2 volts for biasing the negative switched current sources 17.

The positive fixed current sources 12 each provide a positive current of a fixed predetermined value. Furthermore, the positive fixed current sources 12 are weighted. That is, each subsequent source 12 provides a current having a value onehalf as large as the value of the current produced by the positive fixed current source 12 immediately preceding. In FIG. 1, the positive fixed current sources 12 are weighted left-to-right, with the largest current being produced by the first source 19 and the smallest current being produced by the eighth source 26. Since this embodiment contemplates 8 digital bits, there are 8 positive fixed current sources numerically denoted 19,20,21,22,23,24,25 and 26 left to right, respectively.

Eight current direction controlled voltage drop units 13 are serially connected such that the incoming analog signal 18 is introduced to the input 27 of the first current direction controlled voltage drop unit 28 and the output 29 of the eighth current direction controlled voltage drop unit 31 is connected to ground potential 32. In addition, the output 33 of the first positive fixed current source 19 is connected to the input 27 of the first current direction controlled voltage drop unit 28, the output 34 of the second positive fixed current source 20 is connected to the input 36 of the second current direction controlled voltage drop unit 37 and so on down the line until the output 38 of the eighth positive fixed current source 26 is connected to the input 39 of the eighth current direction controlled voltage drop unit 31.

The input of each current direction controlled voltage drop unit 13 is also connected to the inverting input of a corresponding comparator unit 14, and the output of the same current direction controlled voltage drop unit 13 is also connected to the non-inverting input of the same comparator unit 14. Again, there are eight comparator units denoted by the numbers 41, 42, 43, 44, 46, 47, 48 and 49, left to right, respectively. Therefore, the first current direction controlled voltage drop unit 28 is connected to the first comparator unit 41 as described above, the second current direction controlled voltage drop unit 37 is connected to the second comparator unit 42 in a likewise fashion, and so on, until the eighth current direction controlled voltage drop unit 31 is connected to the eighth comparator unit 49 in an analogous manner.

The respective outputs of each comparator unit 14, denoted left-to-right by the numbers 51, 52, 53, 54, 56, 57, 58 and 59, respectively, are connected to separate current switches 16. There are only seven current switches 16, as the eighth comparator unit 49 does not require one to determine the least significant bit. The current switches 16 are connected electrically between the outputs 61 of the current direction units 13 and the outputs 62 of the negative switched current sources 17, which negative switched current sources 17 will now be described.

As with the current switches 16, there are only seven negative switched current sources 17. And, concurrent with the foregoing, the output 62 of the first negative switched current source 63 is connected via the first current switch 64 to the first current direction controlled voltage drop unit 28, the output 62 of the second negative switched current source 66 is connected via the second current switch 67 to the output 61 of the second current direction controlled voltage drop unit 37 and so on until the seventh negative switched current source 68 is connected via the seventh current switch 69 to the output 61 of the seventh current direction controlled voltage drop unit 71. Since there is no eighth negative switched current source 17 or current switch 16, the output 29 of the eighth current direct controlled voltage drop unit 31 is connected only to ground potential 32 as disclosed.

To describe the operation of the above figurative embodiment 10, the following assumptions will be made. The first positive fixed current source 19 provides a positive current of 8 ma, and the first negative switched current source 63 provides a negative current of −8 ma. The second positive fixed current source 20 provides a positive current of 4 ma (half that of the first positive fixed current source 19) and the second negative switched current source 66 provides a negative current of −4 ma (half that of the first negative switched current source 63). Likewise, the third positive and negative current sources 21 and 72 provide currents of 2 ma and −2 ma respectively. The fourth positive and negative current sources 22 and 73 provide currents of 1 ma and −1 ma, respectively. The fifth positive and negative current sources 23 and 74 provide currents of ½ ma and −½ ma, respectively. The sixth positive and negative current sources 24 and 76 provide currents of ¼ ma and −¼ ma, respectively. The seventh positive and negative current sources 25 and 68 provide currents of ⅛ ma and −⅛ ma, respectively. Finally, the eighth positive fixed current source provides a current of 1/16 ma. It should be remembered that there is no eighth negative switched current source 17.

The operation of the figurative embodiment 10 may now be disclosed as follows, assuming again that the analog signal 18 to be converted begins at zero and will move in a continuous fashion to −16 ma. Initially, a 0 ampere input condition will exist. Therefore, at the first stage, the first positive fixed current source 19 will provide the input 27 of the first current direction controlled voltage drop unit 28 with 8 ma of current. The first current direction controlled voltage drop unit 28 will operate to direct the 8 ma signal through the first connecting line 77 to the inverting input 78 of the first comparator unit 41. This will cause a negative output from the comparator 41. This negative output may be read at the output 51 as a "low" or a "zero" digital output. This negative output also directs the first current switch 64 to allow the first negative switched current source 63 to tap into the output 61 of the first current direction controlled voltage drop unit 28. The 8 ma supplied by the first positive fixed current source 19 passes through the first current direction controlled voltage drop unit 28 and is electronically combined with the −8 ma supplied by the first negative switched current source 63. This results in a net current of zero to be introduced to the input 36 of the second current direction controlled voltage drop unit 37.

The above is repeated at the second stage, with the only variance being that instead of 8 ma and −8 ma cancelling each other out, 4 ma and −4 ma cancel each other out. This continues down to the eighth stage with the opposing currents diminishing in value in accordance with the above disclosure. At the conclusion, each stage produces at the output of each comparator unit 14 a negative value, which negative value assumes the identity of a digital "low" or "0". Therefore, the outputs of the comparator units 14 would read left to right 00000000 which is the correct eight bit binary representation for zero, the initial analog input 18.

As the analog input 18 varies with time from an initial current of 0 ma, the input 18 will approach −1/16 ma. This −1/16 ma current will be summed with the 8 ma current provided by the first positive fixed current source 19 to yield a 7 15/16 ma net input current. This positive sum will be directed down to the inverting input 78 of the first comparator unit 41 by the first current direction controlled voltage drop unit 28. This will result in a negative output from the first comparator unit 41 and thereby direct the first current switch 64 to allow the first negative switched current source 63 an avenue to the output 61 of the first current direction controlled voltage drop unit 28. At the output 61 of the first current direction controlled voltage drop unit 28, the −8 ma provided by the first negative switched current source 63 will be summed with the 7 15/16 ma output of the first current direction controlled voltage drop unit 28 to yield a net current of −1/16 ma, which is equal to the original analog input current 18.

Much the same will happen at the second, third, fourth, fifth, sixth and seventh current direction controlled voltage drop unit outputs 61. The positive currents as provided by the positive fixed current sources 12 and diminished by the transferred −1/16 ma current will be substantially cancelled by the negative current provided by the corresponding negative switched current source 17 leaving again only 1/16 ma to be transmitted to the next current direction controlled voltage drop unit 13. However, at the input 39 to the eighth current direction controlled voltage drop unit 31 the net −1/16 ma current will be summed with the 1/16 ma current provided by the eighth positive fixed current source 26, yielding a net current of 0 ma. At this point, there will be no input signal to either input of the eighth comparator unit 49, and the resultant output thereof will be 0. The eighth comparator unit 49 is now at the logical switching state for the least significant bit represented thereby.

If the analog input signal 18 now becomes a bit more negative, this signal 18 will again ripple through the current direction controlled voltage drop units 13 as disclosed above, until it reaches the eighth current direction controlled voltage drop unit 31. The net current between this signal 18 and the eighth positive fixed current source 26 will be slightly negative. This negative current will be directed as before into the first input 79 of the eighth comparator unit 49, thereby causing a positive output therefrom. This positive output is the digital "high" or "1" that represents the analog signal input 18 and forms the binary number 00000001.

This output status will be maintained until the analog input 18 reaches −⅛ ma. This −⅛ ma current will ripple through the current direction controlled voltage drop units 13 as before until it reaches the input 81 to the seventh current direction controlled voltage drop unit 71. At this juncture, the −⅛ ma input current will be summed with the ⅛ ma current provided by the seventh positive fixed current source 25 to yield a net current of 0 ma. This will produce a 0 output from the seventh comparator unit. The seventh comparator unit 48 is now at the logical switching state for the next-to-least significant bit represented thereby. The seventh current switch 69 will continue to operate at this level of input command, and the seventh negative switched current source 68 will continue to apply −⅛ ma to the output 61 of the seventh current direction controlled voltage drop unit 71. This −⅛ ma will be summed with the 0 ma output therefrom and will be further summed with the 1/16 ma provided by the eighth positive fixed current source 26 to yield a net current of −1/16 ma. This negative current will continue to produce a positive signal from the eighth comparator unit 49.

Should the analog input 18 become any more negative, the following occurs. The entire signal 18 again ripples down to the input 81 of the seventh current direction controlled voltage drop unit 71. There it is summed with the ⅛ ma provided by the seventh positive fixed current source 25 to yield a net negative current. This net negative current will cause a positive output from the seventh comparator unit 48, which positive output of the seventh comparator 48 also inhibits the seventh current switch 69 and thereby the seventh negative switched current source 68. Since the negative current supplied by this source 68 is cut off, only the net negative current and the 1/16 ma current provided by the eighth positive fixed current source 26 will be summed at the input 39 to the eighth current direction controlled voltage drop unit 31 yielding a net positive current. This net positive current will cause the eighth comparator unit 49 to have a negative output, thereby representing a digital "low" or "0". This results in a total 8 bit binary number of 00000010, which is the correct number for the second consecutive step in the analog conversion, To continue to describe the above process for all 256 possible binary encodations would be an unwarranted exercise in redundancy, with no significant gain in clarity being realized. It should be noted, however, that as the analog input 18 increases negatively to slightly beyond −3/16 ma, not only will the seventh comparator unit 48 remain stable with a positive output (e.g. a "high"), the eighth comparator unit 49 will also switch to a positive output, as the surviving net negative input to the eighth current direction controlled voltage drop unit 31 will exceed the 1/16 ma provided by the eighth positive fixed current source 26. Since both the seventh and the eighth comparator unit 48 and 49 have positive outputs, the binary number represented by the 8 bit system will be 00000011. It should be clear now that when the analog input 18 negatively exceeds −¼ ma, the sixth comparator unit 47 will have a positive output, and the seventh and eighth comparator units 48 and 49 will have negative outputs, resulting in the binary number 00000100.

It should be obvious from the above to anyone skilled in the art that the described process may be continued until the largest binary number, 11111111, is reached. Furthermore, it should be equally obvious that more bits could be reached by simply adding more stages, and that fewer bits could be realized by subtracting from the existing stages. Finally, it will be seen that as the analog 18 moves back towards the inital zero starting current, the described process will reverse and continue to digitally reflect the analog signal 18 at any given moment.

The foregoing concludes the description of the figurative embodiment 10. Having reference now to FIG. 2, the apparatus required to practice the above teachings may be seen generally as denoted by the numeral 100. The positive fixed current sources are again represented by the number 12, the current direction controlled voltage drop units by the number 13, the comparator units by the numeral 14, the current switches by the numeral 16 and the negative fixed current source by the numeral 17. The apparatus also includes reference voltage sources 101.

The reference voltage sources 11 of FIG. 1 are shown in FIG. 2 at numeral 101 and may be of any type generally known in the prior art capable of producing a positive 8.2 volt output and a negative 8.2 volt output. The positive 8.2 volt output so provided will be connected to the positive fixed current sources as described below, and the negative 8.2 volt output is conected to the negative switched current sources. For the purposes of this disclosure, all upwardly oriented arrows 102 will signify operable connections to a positive 15 volt power supply output and all downwardly oriented arrows 103 will signify operable connections to a negative 15 volt power supply output.

The reference voltage sources 101 are formed generally of two operational amplifiers 104 and 106 and a field effect transistor 107. The first operational amplifier 104 includes a positive feedback 2 k ohm resistor 108 connected between its output 109 and its non-inverting input 111. The inverting input 112 thereof is connected via a 10 k ohm resistor 113 to the node side 114 of a 6.8 volt zener diode 116, the cathode side 117 of which is connected to the non-inverting input 111 of the first operational amplifier 104. The negative 15 volt output 103 is also connected to the anode 114 of the zener diode 116.

The inverting input 112 of the first operational amplifier 104 is also connected by another 10 k ohm resistor 118 to the source 119 of an N-channel field effect transistor (FET) 107, the gate 121 of which is connected to the output 109 of the first operational amplifier 104 and the drain 122 of which is connected to the non-inverting input 123 of the second operational amplifier 106. The positive 15 volt source 102 is connected to the output 109 of the first operational amplifier 104 through a 47 k ohm resistor 104. Finally, the positive 15 volt source 102 is also connected to the non-inverting input 123 of the second operational amplifier 106 by a 10 k ohm resistor 126 and the output 127 of the second operational amplifier 106 is connected to the inverting input 128 thereof by a direct coupling.

Since the first through the seventh positive current sources 19, 20, 21, 22, 23, 24 and 25 are substantially identical, only the first 19 will be described in detail, with differences between the remaining positive fixed current sources 12 being noted where appropriate. The first positive fixed current source 19 is comprised generally of a third operational amplifier 129 in conjunction with a P-channel FET 131. The non-inverting input 132 of the third operational amplifier 129 is connected to the output 127 of the second operational amplifier 106 of the reference voltage sources 101. The output 133 of the third operational amplifier 129 is connected to the gate 134 of the FET 131 with the source 136 thereof being connected to the inverting input 137 of the third operational amplifier 129. Finally, a weighting resistor 138 having a value of 5 k ohms is connected between the inverting input 137 of the third operational amplifier 129 and the positive 15 volt output 102. With reference to the second positive fixed current source 20, the weighting resistor 139 has a value of 10 k ohms. The third positive fixed current source 21 has a weighted resistor 141 value of 20 k ohms, the fourth source 22 has a weighting resistor 142 of 40 k ohms, the fifth positive source 23 has a weighting resistor 143 of 80 k ohms, the sixth positive source 24 has a weighting resistor 144 of 160 k ohms and the seventh positive source 25 includes a weighting resistor 146 of 320 k ohms. These weighting resistors are so valued to provide for the weighted currents disclosed above that are necessary to practice the teachings of the figurative embodiment 10 above.

The current direction controlled voltage drop units 13 are each identical one to the other. Therefore, only the first current direction controlled voltage drop unit 28 will be described in detail with like numerals referring to like parts throughout. The first current direction controlled voltage drop unit 28 is formed of two diodes 147 and 148 connected in parallel cathode to anode. The input 27 of the parallel combination 147 and 148 is connected to the drain 149 of the first positive fixed current source FET 131, to the analog signal input 18 and to the inverting input 78 of the firs comparator unit 41. The output 61 of the parallel combination 147 and 148 is connected to the non-inverting input 151 of the first comparator unit 41 and to the input 36 of the second current direction controlled voltage drop unit 37. The second current direction controlled voltage drop unit 37 is connected to the second positive fixed current source 20 and to the second comparator unit 42 in the same fashion as was the first current direction controlled voltage drop unit 28 affixed to the first positive fixed current source 19 and the first comparator unit 41, and again, the output 61 of the second current direction controlled voltage drop unit is connected to the input 152 of the third current direction controlled voltage drop unit 153. The same connections are made with respect to the third, fourth, fifth, sixth and seventh current direction controlled voltage drop units 13 with the appropriate current direction controlled voltage drop unit 13 being connected between the corresponding positive fixed current source 12 and the corresponding comparator unit 14. Since the eighth positive fixed current source 26 does not include an FET, the input 39 of the eighth current direction controlled voltage drop unit 31 is connected to the output 61 of the seventh direction controlled voltage drop unit 71, the inverting input 79 of the eighth comparator unit 49, and to the 15 vlt positive output 102 via a 1.41 meg ohm resistor 154. It is the latter resistor 154 that forms the eighth positive fixed current source 26. Finally, the output 29 of the eighth current direction controlled voltage drop unit 31 is connected to the non-inverting input 156 of the eighth comparator unit 49 and to ground potential 32.

Each comparator unit 14 consists of a single operational amplifier 157, wherein the inverting and non-inverting inputs are connected to the current direction controlled voltage drop units 13 as disclosed above, and the desired digital readout is obtained from the outputs 51, 52, 53, 54, 56, 57, 58 and 59 therefrom.

Again, since each current switch 16 is identical to every other current switch 16, only the first current switch 64 will be described in detail. The output 51 of the first comparator unit 41 is connected via a 6.2 k ohm resistor 158 to the cathode side of a light emitting diode 159, the anode of which is connected to the positive 15 volt output 102. The outut 51 of the first comparator unit 41 is also connected to the anode side of a second diode 161, the cathode of which is connected to the cathode of a third diode 162. The anode of the third diode 162 is connected to the output 61 of the first current direction controlled voltage drop unit 28. Finally, the junction point between the second and third diodes 161 and 162 is connected to the drain 163 of the FET 164 included in the first negative switched current source 63 (which negative switched current source 63 will be described in detail below). As noted above, each current switch 16 is identical to every current switch 16, with the exception that the second current switch 67 is connected to the second comparator unit 42 in the same fashion as described above, the third current switch 166 is connected to the third comparator unit 43, and so on down the line until the seventh current switch 69 is connected to the seventh comparator unit 48. It will be noted that the eighth comparator unit 49 is not connected to a current switch 16. The output 59 of the eighth comparator unit 49 is connected to the cathode side of a diode 159, however, by a 6.2 k ohm resistor 158, and the anode side of that diode 159 is then connected to the positive 15 volt output 102.

Finally, the negative switched current sources 17 will now be described. Since each negative switched current source 17 is identical to every other negative switched source 17, only the first negative switched current sorce 63 will be described in detail, with differences between the sources 17 being noted where appropriate. The first negative switched current source 63 is formed generally of an operational amplifier 167 and an N-channel FET 164. The non-inverting input 168 of the operational amplifier 167 is connected to the non-inverting input 111 of the operational amplifier 104. The output 169 of the operational amplifier 167 is connected to the gate 171 of the FET 164, the source 172 thereof being connected to the inverting input 173 of the operational amplifier 167. As noted above, the drain 163 of the FET 164 is connected to the junction point between the second and third diodes 161 and 162 included in the first current switch 64. Finally, a weighting resistor 174 having a value of 5 k ohms is connected between the negative 15 volt otput 103 and the source 172 of the FET 164. The second negative switched current source 66 differs from the first 63 only in that the value of the weighting resistor 174 is 10 k ohms, and that the drain 163 of the FET 164 is connected to the second current switch 67, in the fashion as described above. Likewise, the third through the seventh negative switched current sources are connected to the corresponding current switches. The remaining weighting resistor values are as follows: the third negative switched current source 72 has a 20 k ohm weighting resistor 174, the fourth negative switched current source 73 has a 40 k ohm weighting resistor 174, the fifth negative switched current source 74 has an 80 k ohm weighting resistor 174, the sixth negative switched current source 76 has a 160 k ohm weighting resistor 174, and the seventh negative switched current source 68 has a 320 k ohm weighting resistor 174. As noted before, there is no eighth negative switched current source.

In operation, the apparatus 100 disclosed herein conforms to the teachings of the figurative embodiment 10. The elements of the positive fixed current sources 12 operate in a known way to produce currents of the desired weighted values, in response to the input from the reference voltage sources 101 and the biasing of the positive fifteen volt output 102 via the weighting resistors. These currents are directed to the inputs of the diode pair combinations 147 and 148 and to the inverting input of the comparator operational amplifiers 157. A voltage drop exists across the diode pair 147 and 148, the polarity of which voltage drop is dependent upon the direction of the input current. That is, if the incoming current is positive, the voltage drop will be oriented such that a drop is resultant from the input to the output. If the incoming current is negative, the voltage drop will be oriented such that the drop is resultant from the output to the input.

Therefore, so long as the incoming current is positive, there will be a greater positive voltage appearing at the inverting input of the comparator unit 14 than at the non-inverting input thereof. The inverting input will reverse the sign of the input voltage, and the resultant output of the comparator unit 14 will be negative, as consistent with the theory of the figurative embodiment 10. When the incoming current is negative, then the voltage drop will be reversed in polarity, creating a positive output from the comparator unit 14.

When the output from the comparator unit 14 is negative, it will be seen that the current switch 16 diodes 161 and 16 will operate to connect the negative switched current sources 17 to the outputs 61 of the diode pairs 147 and 148. Conversely, when the output of the comparator unit 14 is positive, the negative switched current sources 17 will be blocked by the current switches 16.

In summary, it may be seen that the above-described elements, when joined in the disclosed configuration, will operate in conformance with the teachings of the figurative embodiment disclosed initially. This operation substantially avoids the problems recounted within the prior art, and realizes an analog to digital converter characterized by a minimum number of parts and high speed with high accuracy.

Figure 3:
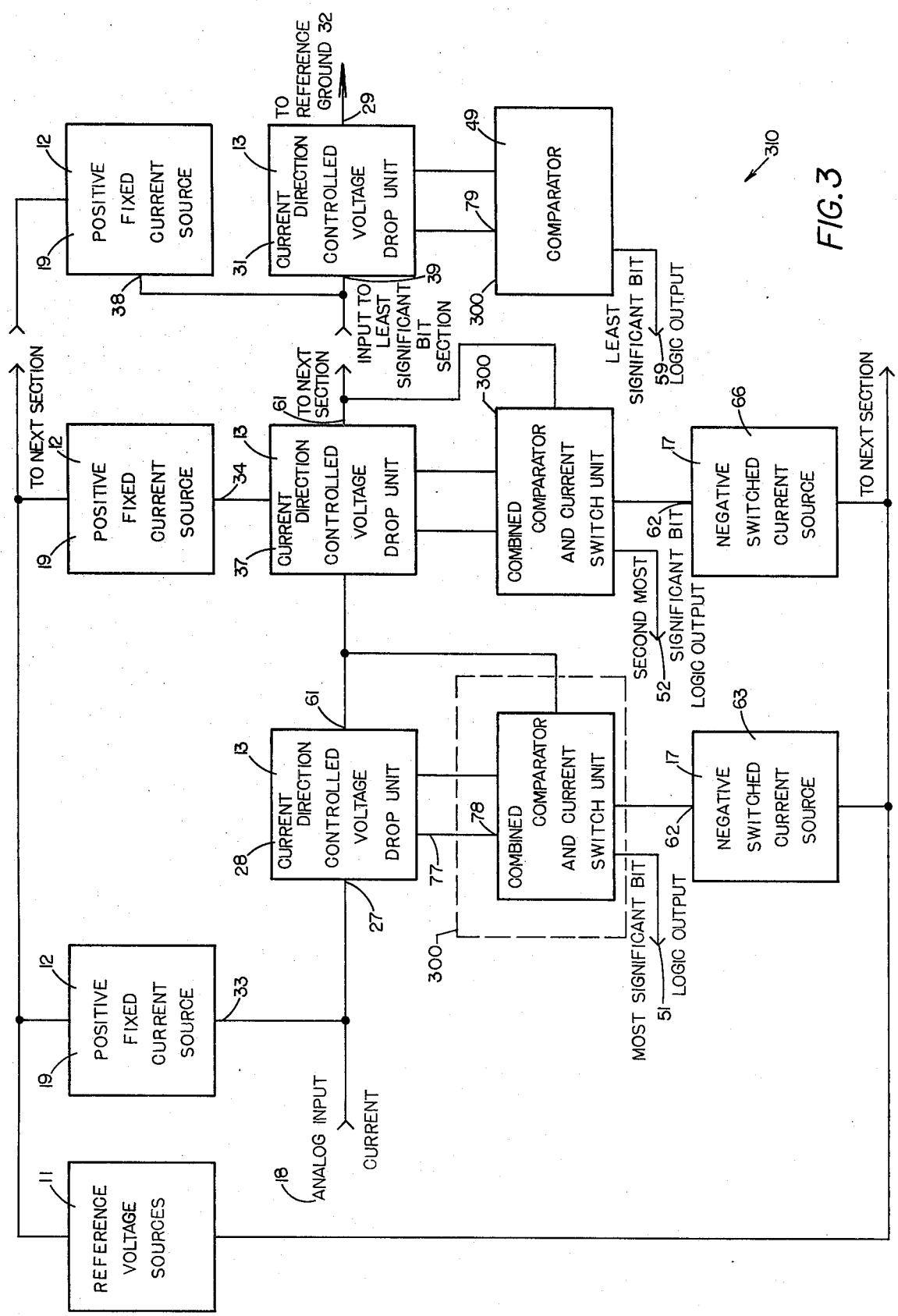
FIG. 3 is a block diagram for a second general embodiment of the invention.

FIG. 3 is a block diagram illustrating a second general embodiment of the invention which is denoted generally by the numeral 310. More specifically, the general embodiment 310 differs from the figurative embodiment 10 in FIG. 1 in that the function of the comparators denoted by the number 14 in FIG. 1 and the current switches denoted by the number 16 in FIG. 1 are both combined into a single circuit block and shown by dashed outlines and denoted specifically in FIGS. 3, 4 and 5 as combned comparator and current switch units 300. The remainder of the cirucit blocks perform exactly the same functions as shown in the figurative embodiment of the apparatus as seen in FIG. 1 and described previously.

Figure 4:
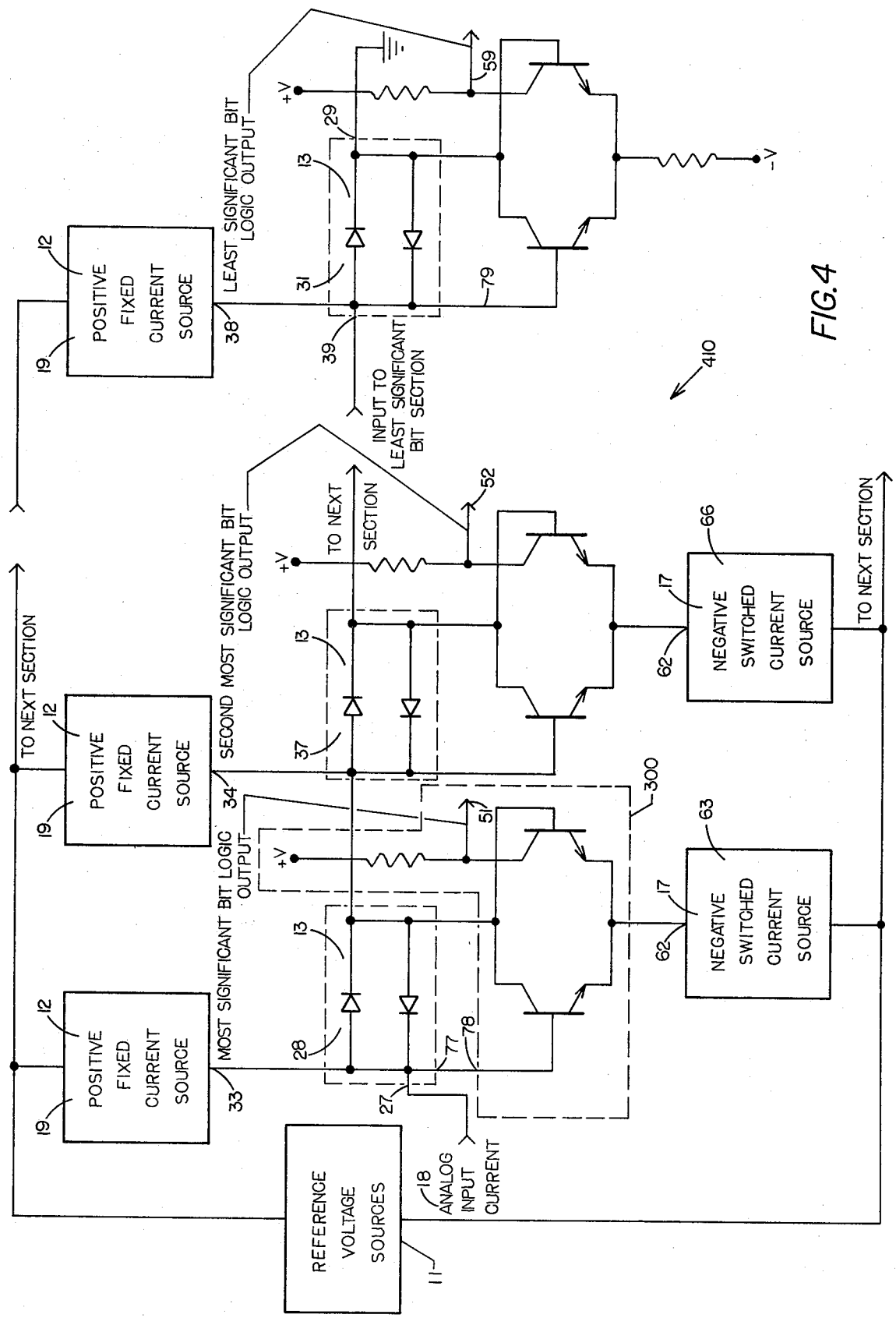
FIG. 4 is a schematic view of a second general embodiment of the invention.
Figure 5:
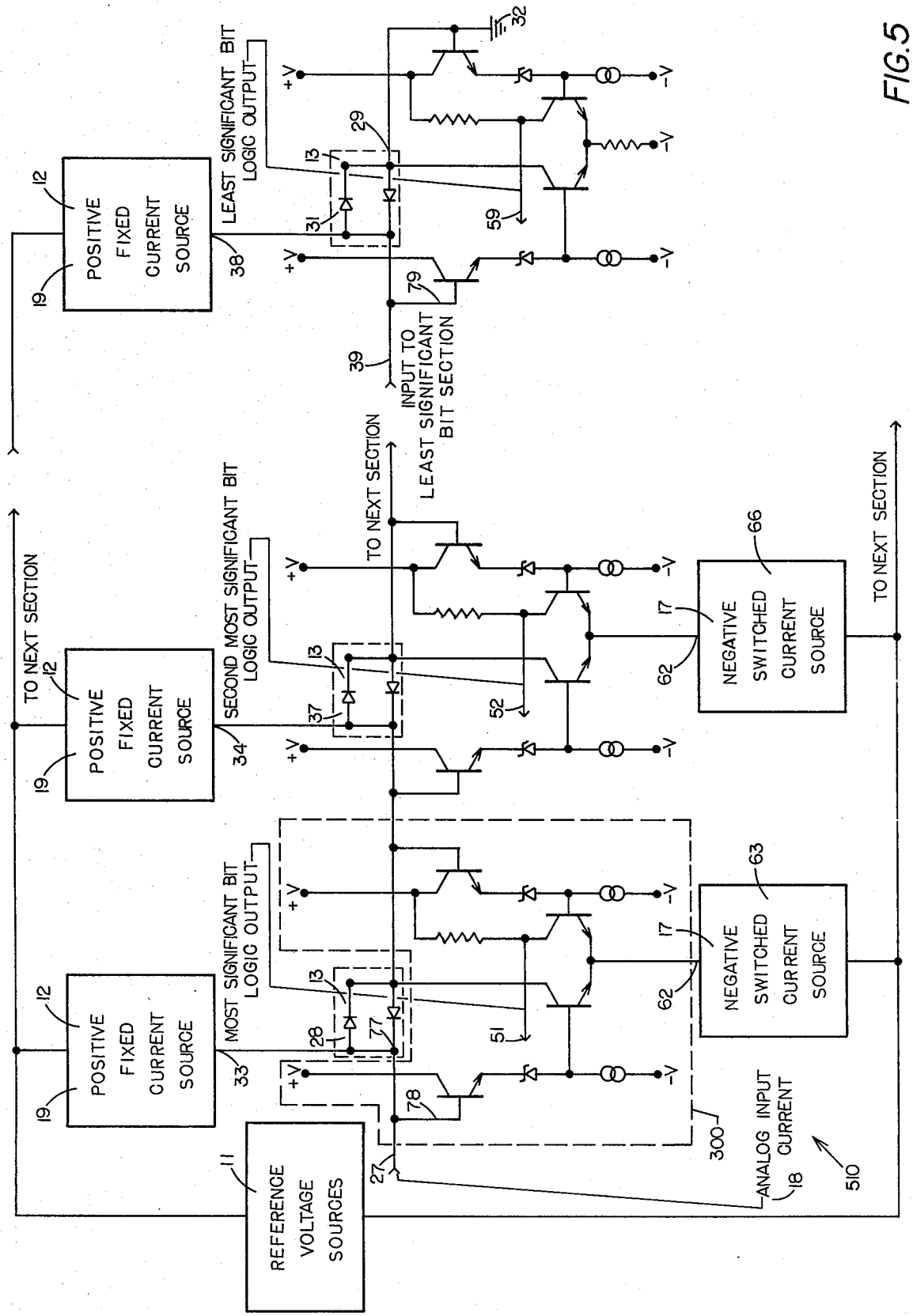
FIG. 5 is a schematic view of a third general embodiment of the invention.

At first glance the differences between the figurative embodiment shown in FIG. 1 and the second general embodiment shown in FIGS. 3, 4 and 5 may appear to be trivial and perhaps redundant. This conclusion, however, is not correct. FIG. 4 is a partial schematic view of the second general embodiment which is denoted generally by the numeral 410 and shows clearly the simplification of the complete circuit of the device when compared to the schematic view of the preferred embodiment shown in FIG. 2. Likewise FIG. 5 is another version of the second general embodiment which is denoted by the numeral 510 and clearly shows a configuration of the device which becomes easier to manufacture as an integrated circuit, is simple in structure, while having the added advantage of greatly enhanced high speed capability.

Figure 6:
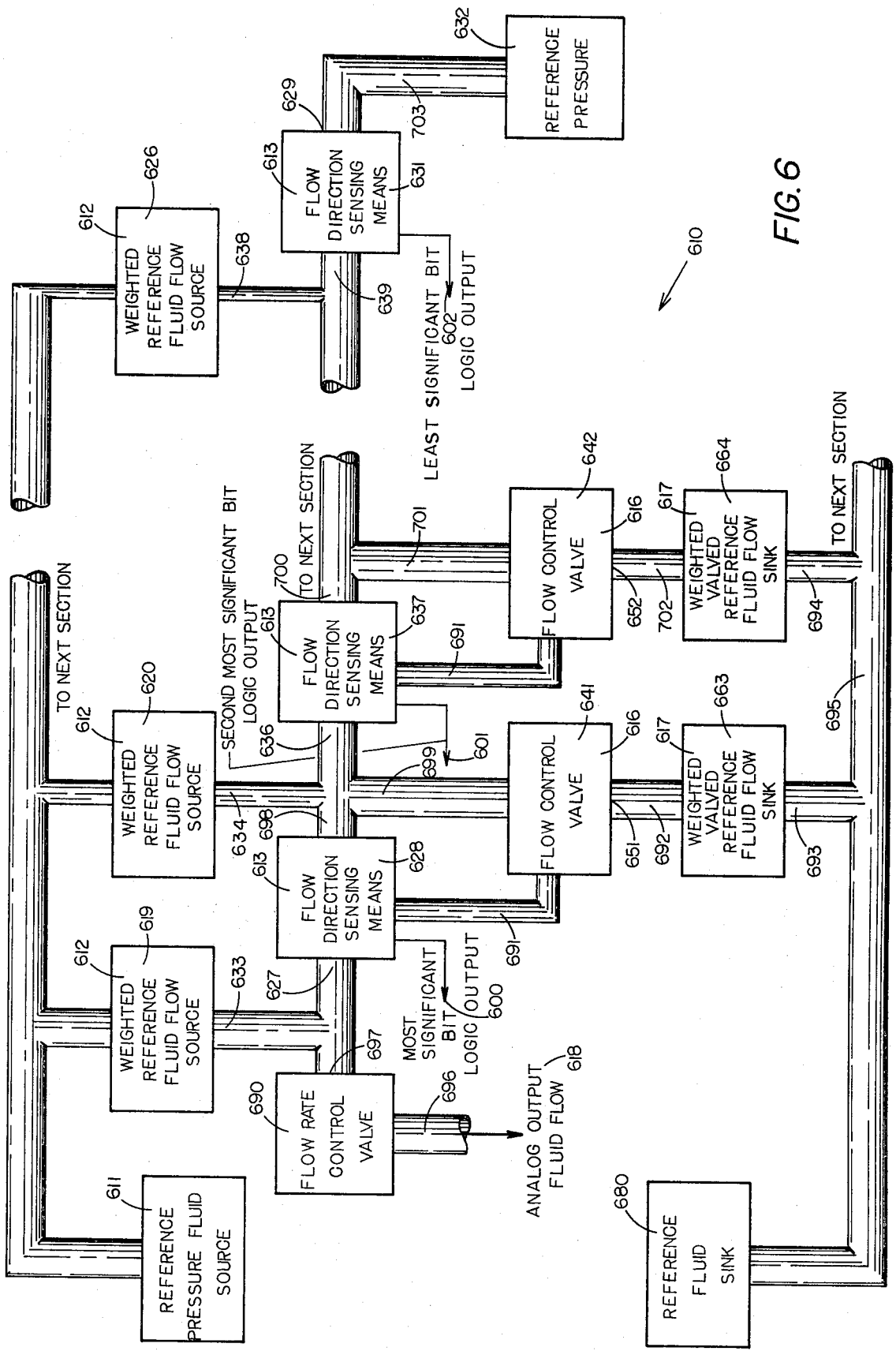
FIG. 6 is a block diagram of a figurative embodiment of the invention as applied to fluid flow applications.

FIG. 6 is a block diagram illustrating a second figurative embodiment of the invention which is denoted generally by the numeral 610. More specifically, the general embodiment 610 differs from the figurative embodiment 10 in FIG. 1 in that the embodiment shown in FIG. 6 is an analog-to-digital converter which is powered by fluid sources and is able to convert a continuously varying flow rate of fluid into a digital code representing the quantity of fluid which has passed through the device. The figurative embodiment 610 includes a reference pressure fluid source 611 and a reference fluid sink 680, a plurality of weighted reference fluid flow sources 612, a plurality of fluid direction sensing means 63, a plurality of flow control valves 616, and a plurality of weighted valved reference fluid flow sinks 617. A reference pressure source 632 is provided to terminate the least significant bit flow direction sensing means 631. An analog output fluid flow 618, and a flow rate control valve 690 complete the converter.

The embodiment 610 as represented herein is for the realization of an n bit digital representation of an analog output fluid flow 618. In order to convert a continuously varying analog output fluid flow to an n bit digital representation of the quantity of analog output fluid flow 618, the fluid flow range is divided into $2^n$ equal parts where n is an integer number representing the number of digital bits.

The reference fluid sink 680 provides a constant negative pressure with respect to the reference pressure fluid source 611 to control n number of weighted valved reference fluid flow sinks 617 having $\frac{1}{2}, \frac{1}{4}, \frac{1}{8} \ldots \frac{1}{2^n}$ magnitude weighting or any desired weighting derived from a reference fluid sink 680. In FIG. 6 the weighted reference fluid flow sources 612 and the weighted valved reference fluid flow sinks 617 are weighted left-to-right, with the largest source being produced by the first source 619 and the largest sink being produced by the first sink 663. The smallest or $n^{th}$ being produced by the last source 626. Since there is no $n^{th}$ weighted valved reference fluid flow sink 617, the input 629 of the $n^{th}$ flow direction sensing means 631 is connected only to a reference pressure source 632.

There are n flow direction sensing means 613 connected serially such that the outgoing analog output fluid flow 618 exits from the output 627 of the first flow direction sensing means 628 and the input 629 of the $n^{th}$ flow direction sensing means 631 is connected to the reference pressure source 632. In addition, the output 633 of the first weighted reference fluid flow source 619 is connected to the output 627 of the first flow direction sensing means 628, the output 634 of the second weighted reference fluid flow source 620 is connected to the output 636 of the second flow direction sensing means 637, and so on down the line until the output 638 of he $n^{th}$ position weighted reference fluid flow source 626 is connected to the output 639 of the $n^{th}$ flow direction sensing means 631.

The output of each flow direction sensing means 613 is also connected to a corresponding flow control valve 616 by a controlling conduct 691. There are n-1 flow control valves 616 denoted by numerals 641 and 642 because the $n^{th}$ flow direction sensing means 631 does not require a flow control valve 616 or a weighted valved fluid flow sink 617 to determine the least significant bit. Therefore, the first flow direction sensing means 628 is connected to the first flow control valve 641 as described above. The second flow direction sensing means 637 is connected to the second flow control valve 642 in a likewise fashion and so on, until the n-1 flow direction sensing means is connected to the n-1 flow control valve. The $n^{th}$ flow direction sensing means 631 does not require connection to a flow control valve 616.

The respective outputs of each flow control valve 616 denoted left-to-right by the numerals 651 and 652 are connected to separate weighted valved reference fluid flow sinks 663 and 664 by conduits 692 and 702 respectively. There are only n-1 weighted valved reference fluid flow sinks required as explained previously.

The output of each weighted valved reference fluid flow sink denoted left-to-right by the numerals 693 and 694 are connected to a conduit 695 and to the reference fluid sink 680.

The analog output fluid flow 618 is connected to the output of the flow rate control valve 690 by conduit 696. The input of the flow rate control valve 697 is connected to the output 627 of the first flow direction sensing means 628 to complete the fluid circuit for the analog-to-digital converter.

To describe the operation of the second figurative embodiment 610, the following assumptions will be made. The reference pressure fluid source 611 provides a constant pressure to the fluid forced through the weighted reference fluid flow sources 612. The first weighted reference fluid flow source 619 provides a fluid flow rate of one-half gallon per minute from its output 633, and the first weighted valved reference fluid flow sink 663 withdraws fluid from conduit 692 at a flow rate of one-half gallon per minute. The reference fluid sink 680 provides a constant negative pressure in conduit 695 with respect to the pressure supplied by the reference pressure fluid source 611. The reference fluid sink 680 accepts the fluid which flows from the outputs 693 and 694 of the weighted valved reference fluid flow sinks 617. The second weighted reference fluid flow source 620 provides a fluid flow rate of one-fourth gallon per minute from its output 634, and the second weighted valved reference fluid flow sink 664 withdraws fluid from conduit 702 at a flow rate of one-fourth gallon per minute and so on down the line with each additional weighted reference fluid flow source and its associated weighted valved reference fluid flow sink allowing a fluid flow rate of one-half the value of the previous stage until the $n^{th}$ stage which does not require a weighted valved reference fluid flow sink.

The operation of the figurative embodiment 610 may now be disclosed as follows, assuming that the analog output fluid flow 618 to be converted begins at zero gallon per minute and will increase in a continuous fashion to about five-eighth gallon per minute. Initially, a zero gallon per minute output condition will exist. Therefore, at the first stage, the first weighted reference fluid flow source 619 will provide a fluid flow rate of one-half gallon per minute flow through conduit 633 to the input 627, and through the first flow direction sensing means 628 in a left-to-right direction, through conduits 698 and 699, through the first flow control valve 641, the conduit 692, the first weighted valved reference fluid flow sink 663, the conduits 693 and 694 into the reference fluid sink 680. At the second stage the second weighted reference fluid flow source 620 will provide a fluid flow rate of one-half the previous stage through conduit 634 to the input 636 and through the second flow direction sensing means 637 in a left-to-right direction, through conduits 700 and 701, through the second flow control valve 642, the conduit 702, the second weighted valved reference fluid flow sink 664, the conduits 694 and 695 into the reference fluid sink 680. The same flow pattern is repeated for each successive stage until the $n^{th}$ stage where the $n^{th}$ weighted reference fluid flow source 626 will provide a fluid flow rate of $\frac{1}{2}^n$ through conduit 638 to the input 639, of the $n^{th}$ flow direction sensing means 631, to its output 629, through conduit 703 and into the reference pressure source 632. It should be remembered that there is no $n^{th}$ weighted valved reference fluid flow sink 617. Whenever fluid flows through a flow direction sensing means 613 in a left-to-right direction, the logic output signal will be at a logical zero state. Since the flow rate control valve 690 was closed, there was zero analog output fluid flow 618. The flow through all of the flow directions sensing means 613 was from left-to-right, therefore, all of the logic outputs 600, 601 and 602 are at a logic state of zero which is the proper logic indication, 0, 0, . . . 0, for zero amount of analog output fluid flow.

When fluid flow through the flow direction sensing means 613 is in a left-to-right direction, the flow control valve 616 associated with each of the flow direction sensing means 613 is opened by the appropriate control conduit 691 thus allowing fluid to pass through the flow control valves 616, the weighted valved reference fluid flow sinks 617, the conduits 693, 694 and 695 and into the reference fluid sink 680. Conversely, when fluid flows through the flow direction sensing means 613 in a right-to-left direction, the flow control valves 616 associated with each of the flow direction sensing means 613 is closed by the appropriate control conduit 691, thus preventing fluid from passing through the flow control valves 616, the weighted valved reference fluid flow sinks 617, the conduits 693, 694, and 695 or into the reference fluid sink 680.

When the flow rate control valve 690 is opened fully to allow the design capacity flow rate through conduits 696 to the analog output fluid flow 618, all logic outputs 600, 601 and 602 will be at logic state of one, that is, 1, 1, . . . 1 because flow through each of the flow direction sesning means 613 is from right-to-left. Therefore, all of the flow control valves 616 will be closed as described previously. When the flow rate control valve 690 is only partially open some quantity of fluid greater than zero and less than design capacity flow rate will flow through conduit 696 to the analog output fluid flow 618. The quantity of the fluid flow will be indicated by a digital code comprised of logical ones and zeros. For the purpose of illustration, if a fluid flow of slightly less than five-eighth gallon per minute is flowing from the analog output fluid flow 618, there will be one-half or four-eighth gallon of fluid flowing from the weighted reference fluid flow source 619, through conduit 633, flow rate control valve 690, conduit 696, and out of the analog output fluid flow 618. The remainder of the fluid flowing from the analog output fluid flow 618 which is in excess of the four-eighth gallon per minute flowing in conduit 633 originates from the weighted reference fluid flow source 620 and flows through conduit 634 and right-to-left through the flow direction sensing means 628. The right-to-left flow through the flow direction sensing means 628 causes the control conduit 691 to close the flow control valve 641, and the logic output 600 to switch to a logical one state. The quantity of fluid flowing from right-to-left through the flow directionsensing means 628 is slightly less than one-eighth gallon per minute; the remainder of the one-fourth gallon per minute flow coming from the weighted reference fluid flow source 620, through conduit 634, will flow from left-to-right through the flow direction sensing means 637 because the flow control valve 641 was caused to close by the right-to-left flow through the flow direction sensing means 628. The left-to-right flow through the flow direction sensing means 637 causes the flow control valve 642 to be open and the logic output 601 to be at a logic state of zero. This flow and switching sequence continues through each stage from left-to-right, that is, from the most significant bit to the least significant bit as long as the quantity of fluid flowing from left-to-right through a flow direction sensing means 613 is slightly more than the quantity of fluid flowing from the least significant bit's weighted fluid flow source 612. At that time the flow through the least significant bit's flow direction sensing means 631 is from left-to-right into conduit 703 and reference pressure source 632 causing the least significant logic output 602 to be at a logic state of zero. Therefore, for the three bits illustrated in FIG. 6, the logic outputs for a flow rate of slightly less than five-eighth gallons per minute will be 1, 0, 0. In this example the most significant bit represents a flow rate of one-half or four-eighth gallon per minute flow rate. The second significant bit is worth one-fourth gallon per minute flow rate, and the third bit is worth one-eighth gallon per minute flow rate. Therefore, the correct logic representation for a flow rate which is more than four-eighth gallon per minute but less than five-eighth gallon per minute is 1, 0, 0.

If a fluid flow of slightly more than five-eighth gallon per minute is flowing from the analog output fluid flow 618, there will be one-half or four-eighths gallon of fluid flowing from the weighted reference fluid flow source 619, through conduit 633, flow rate control valve 690, conduit 696, and out of the analog output fluid flow 618. The remainder of the fluid flowing from the analog output fluid flow 618 which is in excess of the four-eighth gallon per minute flowing in conduit 633 originates from the weighted reference fluid flow source 620 and flows through conduit 634 and right-to-left through the flow direction sensing means 628. The right-to-left flow through the flow direction sensing means 628 causes the control conduit 691 to close the flow control valve 641, and the logic output 600 to switch to a logical one state. The quantity of fluid flowing from right-to-left through the flow direction sensing means 628 is slightly more than one-eighth gallon per minute; the remainder of the one-fourth gallon per minute flow coming from the weighted reference fluid flow source 620, through conduit 634, will flow from left-to-right through the flow direction sensing means 637 because the flow control valve 641 was caused to close by the right-to-left flow through the flow direction sensing means 628. The left-to-right flow through the flow direction sensing means 637 causes the flow control valve 642 to be open and the logic output 601 to be at a logic state of zero. This flow and switching sequence continues through each stage from left-to-right, that is, from the most significant bit toward the least significant bit as long as the quantity of fluid flowing from left-to-right through a flow direction sensing means 613 is slightly more than the quantity of fluid flowing from the least significant bit's weighted reference fluid flow source 612. In the present example slightly more than one-eighth of a gallon per minute flow originating from the weighted reference fluid flow source 620 eventually exits from the analog output fluid flow 618. The remaining part of the original one-fourth gallon per minute flow which originated from the weighted reference fluid flow source 620 is slightly less than one-eighth gallon per minute and flows from right-to-left through the flow direction sensing means 637 because the flow control valve 641 was caused to close by the right-to-left flow through the flow direction sensing means 628. Since the slightly less than one-eighth gallon per minute flow through the flow direction sensing means 637 is from left-to-right, the flow control valve 642 is open thus allowing one-fourth gallon per minute fluid flow to enter the flow control valve 642 through conduit 701 and to flow through conduit 702, weighted valved reference fluid flow sink 664, conduits 694, and 695 and into the reference fluid sink 680. The weighted reference fluid flow source 626 supplies one-eighth gallon per minute flow through conduit 638. This flow is combined with the slightly less than one-eighth gallon per minute flowing from left-to-right through the flow direction sensing means 637 for a total flow available to conduit 701 of slightly less than the one-fourth gallon per minute which flows through conduit 701 whenever flow control valve 642 is open. Therefore, there is a deficit of slightly less than one-eighth gallon per minute at the inlet to conduit 701 which must be made up by the reference pressure source 632 supplying a flow of slightly less than one-eighth gallon per minute through conduit 703, and the flow direction sensing means 631. The make-up fluid which originates from the reference pressure source 632 flows through the flow direction sensing means 631 from right-to-left, therefore, the logic output 602 for the least significant bit is at a logic state of one. Therefore, for the three bits illustrated in FIG. 6, the logic outputs for a flow rate of slightly more than five-eighth gallon per minute will be 1, 0, 1. In this example the most significant bit represents a flow rate of one-half or four-eighth gallon per minute flow rate. The second significant bit is worth one-fourth gallon per minute flow rate, and the third bit is worth one-eighth gallon per minute flow rate. Therefore, the correct logic representation for a flow rate which is more than five-eighth gallon per minute but less than three-fourth gallon per minute is 1, 0, 1.

From this description of the fluid version of the analog-to-digital converter it is obvious that its function is analogous to the previously described electronic version. The flow of fluid in this version is the equivalent of the flow of electric current in the electronic version. It is obvious that any number of stages or bits can be constructed using either the electronic or the fluid configuration.

Figure 7:
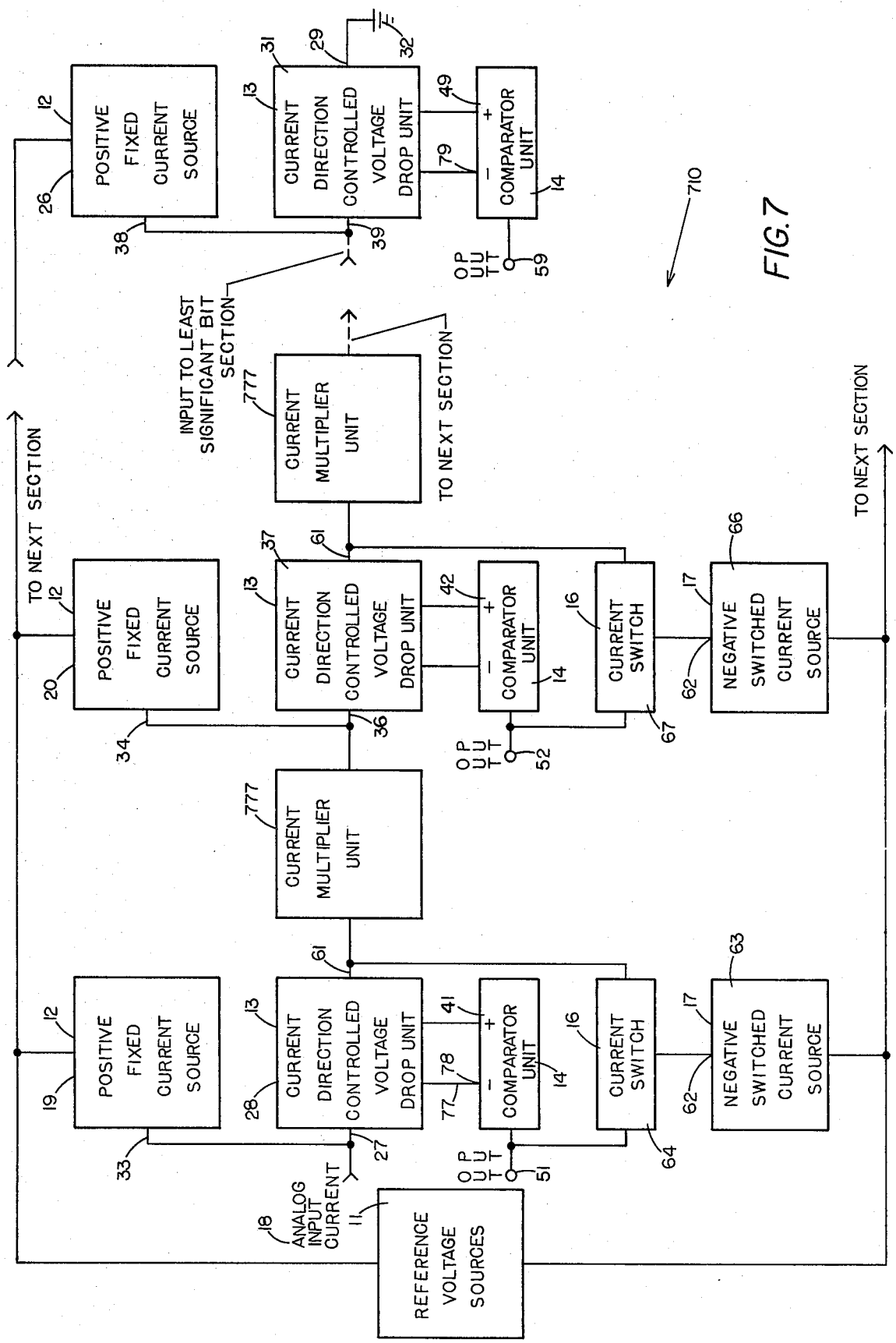
FIG. 7 is an alternate block diagram of a figurative embodiment of the invention similar to that shown in FIG. 1.

FIG. 7 shows an analog-to-digital converter identical to the one in FIG. 1 except for an added current multiplier unit 777 which is connected between the bit sections or stages to accomplish the purpose of changing the current applied to the next lessor significant bit sections in order to accomplish one or more of the following; faster operation, lower power, more convenient biasing, more equal weighting of positive fixed current sources 12 and negative switched current sources 17. In some applications only ony current multiplier 777 may be desired, for example, in an 8 bit converter it may be desired to place a current multiplier 777 between bit stages 4 and 5 to multiply the output current of bit 4 by a factor of 16 in order that the least 4 lessor significant bits may run at the same corresponding current values per bit section as the first 4 significant bits.

Many variations of the embodiment disclosed herein will be obvious to those skilled in the art. Some examples of such variations could include the use of different types of semiconductors, including, FET'S MOSFET'S PNP, and NPN bipolar transistors, changing the polarity of current sources, shifting logic levels, changing polarity of input current, addition of timing and gating circuitry, varying propagation and switching times, and additional circuitry to change the bit extraction time. It is to be understood that these and other variations are not to be taken as outside the intent and scope of the appended claims.

I claim:

1. An analog to digital converter for converting an analog signal into a digital equivalent, comprising:
 a first stage having:
 first positive fixed current source means for providing a first positive current;
 first current direction controlled voltage drop means having an input for the reception of input current and an output, for producing a voltage drop between the input and the output that varies in polarity in response to the sign of the input current, the input being operably connected to said first positive fixed current source means and to the analog signal.
 first comparator means for comparing the input signal with the output signal of said first current direction controlled voltage drop means;
 first negative switched current source means for providing a first negative current; and
 first current switch means operably connected to said first comparator means and further operably connected between said first negative switched current source means and the output of said first current direction controlled voltage drop means, for selectively connecting said first negative switched current source means to the output of said first current direction controlled voltage drop means; and a second stage having:

second positive fixed current source means for providing a second positive current;

second current direction controlled voltage drop means having an input for the reception of input current and an output for producing a voltage drop between the input and the output that varies in polarity in response to the sign of the input current, the input being operably connected to said second positive fixed current sources means and to the output of said first current direction controlled voltage drop means, the output being operably connected to a ground; and second comparator means for comparing the input signal with the output signal of said second current direction controlled voltage drop means.

2. An analog to digital converter as described in claim 1 further comprising one or more third stages substantially identical to said first stage, said third stages being serially connected between said first stage and said second stage.

3. An analog to digital converter as described in claim 2 wherein:

said positive currents provided by said first, second and third stages decrease progressively between said first stage and said second stage, such that said second stage provides the smallest said positive current; and said negative currents provided by said first and third stages decrease in absolute value progressively between said first stage and said second stage, such that the third stage connected proximal said second stage provides the smallest in absolute value negative current.

4. An analog to digital converter as described in claim 3 wherein each said negative current provided by each said first or third stage is the opposite in sign of each said positive current provided by the same said first or third stage, such that the negative and positive current provided by each said first or third stage will sum to zero when electrically combined.

5. An analog to digital converter as described in claim 4 wherein said third stages are serially connected between said first stage and said second stage by operable connection between the current direction controlled voltage drop means of said first, second and third stages.

6. An analog to digital converter as described in claim 5 wherein each said current direction controlled voltage drop means comprises first and second diodes connected anode to cathode in parallel.

7. An analog to digital converter as described in claim 6 wherein each said comparator means comprises a first operational amplifier having a noninverting input, an inverting input and an output.

8. An analog to digital converter as described in claim 7 wherein each said current switch means comprises third and fourth diodes, such that the anode of said third diode is connected to the output of said corresponding first operational amplifier, the anode of said fourth diode is connected to the output of said corresponding current direction controlled voltage drop means, and the cathodes of said third and fourth diodes are connected together.

9. An analog to digital converter as described in claim 8 wherein each of said first positive fixed current source means comprises a second operational amplifier having an inverting input, a noninverting input and an output, a first field effect transistor having a source, gate and drain, a first resistor and a first voltage source, such that the output of said second operational amplifier is connected to the gate of said first field effect transistor, the inverting input of said second operational amplifier is connected to the source of said first field effect transistor, said first resistor is connected between said first voltage source and the source of said first field effect transistor, the drain of said first field effect transistor is connected to the input of said corresponding current direction controlled voltage drop means and the non-inverting input of said second operational amplifier is connected to the non-inverting input of every other second operational amplifier, the non-inverting input of said second operational amplifier included in said first positive fixed current source means being connected to a signal source.

10. An analog to digital converter as described in claim 9 wherein each of said negative switched current source means comprises a third operational amplifier having an output, an inverting input and a non-inverting input, a second field effect transistor having a gate, source and drain, a second resistor and a second voltage source, such that the output of said third operational amplifier is connected to the gate of said second field effect transistor, the inverting input of said third operational amplifier is connected to the source of said second field effect transistor, the drain of said second field effect transistor is connected to the cathodes of said third and fourth diodes, the non-inverting inputs of said third operational amplifiers are connected together, and said second resistor is connected between the source of said second field effect transistor and said second voltage source.

11. An analog-to-digital converter for converting an input current into an n bit digital word output, n being an integer number, comprising:

means for providing n numbers of pairs of current sources and switched current sources of $\frac{1}{2}, \frac{1}{4}, \frac{1}{8}, \ldots \frac{1}{2^n}$ magnitude weighting or any desired weighting;

n comparator means for producing the logic bits and driving the current switches;

n current switch means for switching the switched current sources;

n current direction controlled voltage drop unit means for producing a voltage drop created by the current flowing therethrough for the purpose of driving the comparator, wherein said current sources, switched current sources, current direction controlled voltage drop unit means, comparators, and current switch means are operably coupled into n sections in series to steer the currents therethrough so that the first section compares the amplitude of the input current with the $\frac{1}{2}$ magnitude current source and generates the most significant bit while at the same time summing the $\frac{1}{2}$ magnitude switched current source through the current switch means with the result being the algebraic sum of the input current minus the $\frac{1}{2}$ magnitude current source summed with the switched current source;

said switched current source being switched by the current switch;

said result being applied to the second section, the second section comparing the resultant current from the first section with the ¼ magnitude current source for generating the second most significant bit while at the same time summing the ¼ magnitude switched current source through the current switch means, the result being applied to the third section and so on to the remaining sections until the n bit digital word output is formed from the input current.

12. An analog-to-digital converter for converting an input current into an n bit digital word output, n being an integer number, comprising:

means for providing n number of pairs of current sources and switched current sources of ½, ¼, ⅛, . . . ½$^n$ magnitude weighting or any desired weighting derived from reference voltage sources;

n combined comparators and current switch means for generating the logic bits and switching the switched current sources;

n current direction controlled voltage unit drop means for producing a voltage drop created by the current flowing therethrough for the purpose of driving the combined comparator and current switch, wherein said current sources, switched current sources, current direction controlled voltage unit drop means, and combined comparator and current switch means are operably coupled into n sections in series to steer the currents therethrough so that the first section compares the amplitude of the input current with the ½ magnitude current source and generates the most significant bit while at the same time summing the ½ magnitude switched current source through the combined comparator and current switch means with the result being the algebraic sum of the input current minus the ½ magnitude current source summed with the switched current source;

said switched current source bing switched by the combined comparator and current switch;

said result being applied to the second section, the second section comparing the resultant current from the first section with the ¼ magnitude current source for generating the second most significant bit while at the same time summing the ¼ magnitude switched current source through the combined comparator and current switch means, the result being applied to the third section and so on to the remaining sections until the n bit digital word output is formed from the input current.

13. An analog-to-digital converter for converting an output fluid flow through the flow rate control valve into an n bit digital word output, n being an integer number comprising:

means for providing n number of pairs of weighted reference fluid flow sources and sinks of ½, ¼, ⅛, . . . ½$^n$ magnitude weighting or any desired weighting derived from a reference pressure fluid source and reference fluid sink;

n flow direction sensing means for generating the logic bits and driving the flow control value;

n flow control valve means for controlling the weighted valved reference fluid flow sinks wherein said weighted reference fluid flow sources, weighted valved reference fluid flow sinks, flow direction sensing means, and flow control valves are operably connected into n sections in series to steer the fluid flows therethrough so that the first section subtracts the magnitude of the output fluid flow passing through the flow rate control valve from the ½ magnitude weighted reference fluid flow source and the difference flows through the flow direction sensing means which generates the most significant bit while at the same time the flow direction sensing means drives the flow control valve and sums said difference flow with the ½ magnitude weighted valved reference fluid flow sink through the flow control valve with the resultant flow being the algebraic sum of the output fluid flow passing through the flow rate control valve minus the ½ magnitude weighted reference fluid flow source summed with the weighted valved reference fluid flow sink;

said weighted valved reference fluid flow sink being controlled by the flow control valve;

said resultant flow being applied to the second section where it is sbutracted from the ¼ weighted reference fluid flow source for generating the second most significant bit while at the same time summing the ¼ magnitude weighted valved reference fluid flow sink through the flow control valve, the resulting fluid flow being applied to the third section and so on to the remaining sections until the n bit digital word output is formed from the output fluid flow.

14. The converter according to claim 13 wherein analog output fluid flow becomes input fluid flow, weighted reference fluid flow source becomes weighted reference fluid sink, and weighted valved reference fluid flow sink becomes weighted valved reference fluid flow source.

15. The converter according to claim 11 wherein current multiplying means are placed between one or more serially connected bit sections.

16. The converter according to claim 12 wherein current multiplying means are placed between one or more serially connected bit sections.

* * * * *